(12) United States Patent
Bollenbeck et al.

(10) Patent No.: US 7,890,070 B2
(45) Date of Patent: Feb. 15, 2011

(54) FILTER CIRCUIT ARRANGEMENT

(75) Inventors: Jan Bollenbeck, Eggolsheim (DE);
Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 686 days.

(21) Appl. No.: 11/937,552

(22) Filed: Nov. 9, 2007

(65) Prior Publication Data

US 2008/0136473 A1      Jun. 12, 2008

(30) Foreign Application Priority Data

Nov. 9, 2006   (DE) ................. 10 2006 052 873

(51) Int. Cl.
*H04B 1/18* (2006.01)
*H04B 7/00* (2006.01)
(52) U.S. Cl. .................. 455/180.3; 455/260; 455/307
(58) Field of Classification Search .............. 455/180.3, 455/180.2, 130, 260, 307, 306; 327/156, 327/147
See application file for complete search history.

(56) References Cited

U.S. PATENT DOCUMENTS

| | | | | |
|---|---|---|---|---|
| 5,949,832 | A * | 9/1999 | Liebetreu et al. | 375/344 |
| 6,212,367 | B1 * | 4/2001 | Tolson | 455/114.2 |
| 6,377,788 | B1 * | 4/2002 | Elder et al. | 455/266 |
| 6,420,916 | B1 | 7/2002 | Freeman | |
| 7,135,940 | B2 * | 11/2006 | Kawakubo et al. | 333/17.1 |
| 2003/0231053 | A1 * | 12/2003 | Kim | 327/552 |
| 2007/0035350 | A1 | 2/2007 | Bollenbeck et al. | |

FOREIGN PATENT DOCUMENTS

DE        23 63 387        8/1976

OTHER PUBLICATIONS

"Dual-bandwidth Loop Speeds Phase Lock," Anderson et al, Electronics, Jan. 9, 1975 (pp. 116-117).
"Direct Digital Synthesis (DDS) Controls Waveforms in Test, Measurement, and Communications," Murphy et al, Analog Dialogue 39-08, Aug. 2005, pp. 1-4.

* cited by examiner

*Primary Examiner*—Sonny Trinh
(74) *Attorney, Agent, or Firm*—Schiff Hardin LLP

(57) ABSTRACT

A filter circuit arrangement for filtering of a radio-frequency signal has a first tunable filter and a phase regulation loop in order to hold the first tunable filter to a transmission phase constant relative to the frequency of the radio-frequency signal. The filter circuit arrangement has a second tunable filter arranged parallel to the first tunable filter in the phase regulation loop. The first tunable filter and the second tunable filter exhibit different attenuation characteristics and are fashioned and connected within the phase regulation loop so that: a capture range of the filter circuit arrangement, in which a tuning of the phase regulation loop to a radio-frequency signal to be filtered is possible is dominated by the attenuation characteristic of the second tunable filter, and so that the transmission behavior of the filter circuit arrangement in operation is dominated by the attenuation characteristic of the first tunable filter, given a tuned phase regulation loop. A circuit arrangement for generation of a local oscillator signal has an oscillation generator and a filter circuit arrangement as described above arranged downstream of the oscillation generator.

16 Claims, 7 Drawing Sheets

FILTER CIRCUIT ARRANGEMENT

BACKGROUND OF THE INVENTION

1. Field of the Invention

The present invention concerns a filter circuit arrangement for filtering a radio-frequency signal with a tunable circuit and a phase regulation loop in order to hold the tunable filter to a constant transmission phase relative to the frequency of the radio-frequency signal.

2. Description of the Prior Art

In many technical fields, high-quality radio-frequency signal sources, whose signal frequencies can be adjusted in small steps (i.e. virtually continuously), are necessary in a number of applications. A typical example is local oscillators in receivers and transmitters in communication technology. For example, specific lower and upper frequency limits, an optimally low frequency step width and an optimally high step speed with simultaneously high adjustment precision and constancy of the set frequency, are among the requirements for such a radio-frequency signal source. Moreover, normally a minimal phase noise interval dependent on the frequency interval from the carrier as well as a minimal interference signal interval is specified that may not be under-run. Signal sources that operate according to the principle of direct digital synthesis (DDS) are particularly suitable for such applications in which very small frequency step widths are required. Direct digital synthesis is a technique in which digital data processing blocks are used in order to produce a highly precise clock pulse source with fixed frequency relative to a frequency- and phase-adjustable output signal. In essence, the reference clock pulse within the DDS architecture is thereby sub-divided with a division factor that is stored in a programmable, binarily adjustable word. The data word is typically 24 to 48 bits wide, and the output signal can be adjusted with an extraordinarily high frequency resolution with such a DDS module. For technical reasons, however, the resolution of the phase accumulator output is limited to a practical data word width in available DDS modules. Only a specific number of the higher-value bits of the data word is processed and the lower-value bits are ignored. A more or less significant amplitude error thus arises in each output value of a DDS system. Since this error sequence cyclically repeats in a periodic output signal, discrete interference lines (which are typically also designated as "spurious signals" often appear in the frequency spectrum of the DDS output signal. The amplitude and frequency position of these interference signals are dependent on the present data word with which the step width of the accumulator (and thus the frequency of the output signal) is established. Such spurious signals can lead to disruptions in the appertaining application in which the DDS system is used as a local oscillator. For example, if (as an oscillator) a frequency mixer of a transmitter is controlled with a DDS signal, unwanted ancillary emissions can occur. In reverse, unwanted ancillary reception points can arise at the receiver side given use of a DDS signal as a local oscillator signal. Given a use of DDS signals as local oscillators in a medical imaging method, this can also lead to artifacts, for example.

In the ADI application document, "Direct Digital Synthesis (DDS) Controls Waveforms in Test, Measurement and Communications" (analog.com/library/analogDialogue/archives/39-08/dds_apps.pdf), a hybrid architecture in which the reference signal input is fed from a DDS module to a phase regulation loop (also designated in the following as a "phase locked loop" or "PLL" for short) is described under the chapter "Fine-tunable reference for a PLL". A rough frequency selection by adjustment of the divisor factor in the PLL feedback path is possible with this hybrid system. Fine frequency steps can be adjusted with a very high resolution via specification of the DDS frequency. For the reference signal the phase regulation loop thereby acts like a bandpass with double the bandwidth of the loop filter. The signal-to-noise ratio of spurious signals whose frequency interval relative to the reference signal is greater than the loop bandwidth of the phase regulation loop consequently increases due to the filter effect. Due to the multiplicative frequency conversion by the factor N, however, the interference signal interval within the PLL decreases by 20·log(N) [dB], such that the signal-to-noise ratio for interference signals is also reduced by this value within the regulatory loop bandwidth. Given the dimensioning of the bandwidth of the regulatory loop and of the reference frequency, a compromise is to be entered into with regard to noise performance, switching speed and interference signal suppression. Spurious signals outside of the tuning range of the DDS can in fact be suppressed via a fixed bandpass filter arranged downstream of the DDS. Spurious signals lying within the DDS tuning range pass the filter unattenuated.

A further variant in which the DDS signal is mixed with the feedback signal of the PLL is described in the same document. This variant is designated as an offset PLL. Here as well the high frequency resolution of DDS can be utilized. However, since the output signal of the mixer initially runs through a splitter with the divisor N before it arrives in the phase detector input of the phase regulation loop, the effect of the (in principle) decrease of the signal-to-noise ratio described above is compensated. However, the output signal is charged with additional noise due to the mixing process. Spurious signals within the filter bandwidth or within the loop filter bandwidth appear with unchanged level offset relative to the carrier on the output signal of the phase regulation loop.

Another possibility for generation of an optimally good reference signal (in particular as a local oscillator signal) is proposed in DE 10 2005 024 624. In the system described there a quartz oscillator operated in a regulated oven (what is known as an "oven-controlled oscillator; OCXO) is used and the output signal of this OCXO is then conducted through a phase-regulated filter circuit arrangement of the aforementioned type. A frequency multiplier is arranged downstream of the phase-regulated filter circuit arrangement. This design is shown in FIG. 1, whereby the basic principle of such a phase-regulated filter is presented using this example. An essential component of the phase-regulated filter circuit arrangement 1 is a filter module 5, here a quartz filter with variable center frequency. This tunable filter 5 is tuned within the phase regulation loop 4 such that the center frequency of the filter 5 can follow an input signal drifting in terms of frequency. Components of this phase regulation loop 4 are typically: a desired (target) actual value comparator or, respectively, phase comparator 6 (also often called a phase detector), here in the form of a multiplication element 6; a downstream integral regulator 7; and a low-pass filter 8. The principle functions such that the signal coming from the oscillator 2 is directed to the input of the detuneable filter 5, and to the phase comparator 6 as a reference signal (i.e. as a desire signal). The output signal coming from detuneable filter 5 is likewise fed back to the phase comparator 6 as a real signal or feedback signal. The output signal of this phase comparator 6 is dependent on the phase difference between the output signal of the filter 5 and the input signal of the filter circuit arrangement. A control signal is correspondingly generated in the integral regulator 7 and downstream low-pass filter 8, which control signal is provided to the control input 9 of the detuneable 5 in order to appropriately correct the filter 5.

The outgoing signal is then passed to the frequency multiplier 3, which generates the desired local oscillator signal. Such a corrected filter on the basis of a phase regulation loop does in fact have the advantage that the center frequency of the filter automatically follows the wandering frequency of the input signal, but a problem is that the capture range of the phase regulation loop stands in direct correlation to the bandwidth of the employed filter 5 within the filter arrangement 1. The capture range also shrinks with dropping bandwidth. The frequency range in which the phase regulation loop can be tuned to the corresponding input frequency is hereby designated as a capture range. If, during a tuning process of the phase regulation loop to the filter edge, the input signal is located far removed from the current filter center frequency of the filter 5, the level of the fed-back signal is not sufficient for an operation of the phase detector 6. The regulation can therefore not tune or "capture" or "lock". The capture range can in fact be enlarged by increasing the bandwidth of the filter 5 used in the filter circuit is increased, but this has the disadvantage that the filter circuit arrangement no longer filters as well, and also that spurious signals lying further removed from the center frequency can pass through the filter. For this reason the filter circuit arrangement is not suitable for applications in which a large selection on the one hand and a large capture range on the other hand are required. The design of a circuit arrangement for generation of a local oscillator signal adjustable in a wider frequency range (for example with a DDS as an oscillator) is thus not possible with this filter circuit arrangement.

A further phase-regulated tracking filter is described in U.S. Pat. No. 6,420,916. In this design the problem also exists that, given an input signal whose frequency lies far outside the current set (via the variable center frequency) through-pass band, the amplitude of the fed-back signal is not sufficient in order to let the loop lock.

A tracking filter that has as a frequency-selective function block a low-pass filter bank connected to an N-path filter is disclosed in DE 23 63 387. In order to achieve a decoupling of filter capture range and filter bandwidth/quality, it is proposed to bridge the filter bank in the unlocked state via a detour path. The attenuation of the detour path is regulated via the amplitude of the output signal. The minimal attenuation of the detour path is selected such that on the one hand the amplitude of the output signal is sufficient to let the filter lock, but the signal amplitude at the output of the detour branch is distinctly smaller than at the output of the filter bank in the locked state. The attenuation in the detour path is successively increased with increasing output level. In the locked state the detour path is regulated so as not to be traversed. This particular type of capture range expansion is limited, however, to the specific application with N-path filters (since the transmission phase of the detour path for the locking process of the filter hereby remains unconsidered) and is not suitable for a usage with classical LC filters. However, N-path filters exhibit known, serious disadvantages relative to classical LC filters.

In the article "Dual bandwidth loop speeds-phase lock" by A. T. Anderson et al. in Electronics, 1975 Jan. 9, p. 116 to 117, a PLL is described in which selection can be made between two different loop paths. By a suitable execution of the cross-over switch it is achieved that the change-over from one loop path to the other path is optimally smooth. The cross-over to a lower bandwidth occurs after the locking of the PLL. Since in such a design the VCO monitoring voltage must possess a direct voltage portion, in principle the loop filters must exhibit a low-pass behavior. Therefore only the loop bandwidth (i.e. the upper limit frequency) of the low-pass filter is changed by the described arrangement. The design is thus not suitable for high-frequency bandpass filters.

SUMMARY OF THE INVENTION

An object of the present invention is to improve a filter of the aforementioned type so that the capture range is enlarged, while not impairing the transmission behavior (advantageously the high selectivity of the filter) by the expansion of the capture range.

This object is achieved according to the invention by a filter circuit arrangement having a second tunable filter arranged in parallel to the aforementioned (first) tunable filter in the phase regulation loop. The first tunable filter and the second tunable filter exhibit different attenuation characteristics and are thus fashioned and connected within the phase regulation loop such that the capture range of the filter circuit arrangement, in which a tuning of the phase regulation loop to a radio-frequency signal to be filtered is possible, is dominated by the attenuation characteristic of the second tunable filter, and the transfer behavior (in particular the bandwidth) of the filter circuit arrangement is dominated in operation by the attenuation characteristic of the first tunable filter given a tuned phase regulation loop. The term "attenuation characteristic" of a filter, as used herein means the attenuation effect of the filter on a signal passing through the filter, dependent on its frequency.

In other words, the phase regulation loop is expanded by a filter side branch which specifically provides the capture range, in contrast to which the main branch within the phase regulation loop can be operated with a largely arbitrarily predetermined attenuation characteristic in order to thus have in the locked state a filter circuit arrangement with the desired selectivity.

As described above, the capture range should advantageously be optimally wide, but the selectivity of the filter circuit arrangement should be very high in the locked state of the phase regulation loop. The attenuation characteristics of the first and second tunable filters are therefore advantageously selected such that the first tunable filter exhibits a narrower (particularly preferably a very much narrower) filter bandwidth than the second tunable filter.

The first tunable filter can also be fashioned such that its attenuation characteristic exhibits at least one attenuation indent (typically also designated as a "notch"). Such a filter circuit arrangement is, for example, suitable for filtering of a signal whose frequency can be displaced over more than one octave. Here the difficulty exists in that the harmonics of the signal cannot be suppressed via fixed low-pass filters since, for example, the second harmonic of the lowest frequency that can be set lies below the highest frequency that can be set. Therefore the first tunable filter is preferably fashioned such that at least one attenuation notch lies in the range of the harmonics of a center frequency of the filter. Filters with a plurality of attenuation notches can also be designed such that not only the second harmonics but also the 3rd, 4th, 5th, . . . harmonics are suppressed.

As its input side, the filter circuit arrangement has a suitable power splitter in order to split the input signal of the filter circuit arrangement into a first partial signal for the first tunable filter, a second partial signal for the second tunable filter and a third partial signal as a desired value signal for the phase regulation loop. An adder element (adder stage) that adds an output signal of the first tunable filter and an output signal of the second tunable filter to form a feedback signal is located within the phase regulation loop in order to merge the filter main branch and the filter side branch. This adder stage advantageously exhibits a sufficient decoupling of the two input gates in order to avoid that signal portions from the side branch arrive in the main branch since this would reduce the selection of the filter.

In a preferred embodiment, an output of the adder element is initially coupled with an inverter in order to invert the feedback signal. A first frequency splitter that halves the frequency of the inverted feedback signal is arranged downstream of this inverter. Moreover, a second frequency splitter that halves the frequency of the desired value signal is arranged downstream of the output of the power splitter at which the desired value signal is output. The outputs of the first and second frequency splitters lead to the multiplier element in the phase regulation loop, which multiplier element multiplies the subdivided, inverted feedback signal and the subdivided desired value signal to generate a control signal for the first and second tunable filters. As is subsequently explained in more detail, this has the advantage that the aforesaid multiplier can be used as a phase detector, whereby this outputs an output voltage of 0 volts as a control value in the locked state of the phase regulation loop. The regulation of amplitude fluctuations of the reference variable and of the feedback is decoupled in this manner.

As mentioned, for the selectivity of the filter circuit arrangement it is important that optimally no signal portions of the side branch can arrive in the main branch. This in particular applies in the locked state of the phase regulation loop. In order to ensure this, in a preferred variant a switching element is connected between the output of the second tunable filter and the adder element. This is controlled by a detector circuit (for example a suitable "lock detection" circuit) such that the relaying of the output signal of the second tunable filter to the adder element is interrupted when the phase regulation loop is tuned. For example, a suitable window comparator with which the control signal for the two tunable filters is detected can be used as a detector circuit.

An important point for a particularly good functioning of the entire filter arrangement is that the center frequencies of the tunable filters used in the filter main branch and in the filter side branch always vary synchronously dependent on the control signal generated in the regulatory loop. Resonators (for example LC oscillating circuits, oscillating crystals etc.) present in the first and in the second tunable filters are therefore preferably fashioned essentially identically. This means that they are fashioned identically at least insofar as that they are detuned synchronously dependent on the control signal.

The operating performances of the filters typically determine the respective filter bandwidths. For example, it can therefore be ensured that the two filters are designed with identical resonators, such that the operating performance of the first filter is relatively high and thus this filter has a high selectivity. By contrast, the operating performance of the second filter in the side branch is designed low, such that the filter output signal maintains a level sufficient for operation of the phase detector across the entire predetermined frequency range. In order to ensure that the first tunable filter dominates in the main branch given a locked phase regulation loop, the second tunable filter preferably exhibits a stronger fundamental attenuation relative to the first tunable filter (meaning that it is additionally attenuated overall, for example by approximately 2 to 5 dB, particularly preferably by 3 dB).

There are various possibilities for the design of the filters. The first and second tunable filters can each have an oscillating circuit with an inductor (i.e., for example, a suitable coil) and an adjustable capacitor connected with a control input of the appertaining filter. For example, a varactor diode or other capacitor diode is suitable as an adjustment capacitor. In order to adjust the operating performance and thus, for example, the bandwidth of the respective filter, an ohmic resistor that reduces the operating performance can be connected in parallel to the inductor and the capacitor within the oscillating circuit. Since an optimally high operating performance is required by the first tunable filter used in the main branch, it is sufficient when such an ohmic resistor is used only in the oscillating circuit of the second tunable filter in order to reduce its operating performance and to widen the bandwidth. For example, the use of such an ohmic resistor can be foregone in the first detuneable filter in order to not reduce the selectivity.

Insofar as the attenuation characteristic in such a filter design should be fashioned so as to exhibit an attenuation notch, at least one suitable inductor can advantageously be connected in series to the capacitor within the oscillating circuit. The value that the individual inductors and capacitors must exhibit in order to reach an attenuation characteristic with an attenuation notch in a specific frequency position relative to the center frequency is explained later using an exemplary embodiment.

The first tunable filter as well as the second tunable filter particularly preferably each contain decoupled buffer amplifiers, respectively, the input side thereof before-the-oscillating circuit and on the output side after the oscillating circuit. For example, cascode amplifiers can be used for this purpose. Such amplifiers exhibit a high input resistance as well as a very high isolation (i.e. decoupling). In principle these amplifiers are also advantageously designed identically in both tunable filters, but the attenuation of both tunable filters can hereby be adjusted differently by corresponding selection of the matching components.

Such a filter circuit arrangement can be used for various purposes in which it is necessary to have a filter that tracks the frequency of the signal to be filtered, while also offering a specific (optimally high) selectivity. Such a filter circuit arrangement is preferably used in a circuit arrangement for generation of a local oscillator signal. Such a circuit arrangement need then only have a suitable oscillation generator and an inventive filter circuit arrangement downstream of the oscillation generator. A DDS system is advantageously used as an oscillation generator in order to obtain a local oscillator signal adjustable over a wide range. Another oscillator module can be used, for example an OCXO as described in DE 10 2005 024 624.

DESCRIPTION OF THE PREFERRED EMBODIMENTS

The basic principle of a circuit arrangement for generation of a local oscillator with an oscillation generator and a downstream filter circuit arrangement with a phase regulation loop was already explained above using FIG. 1. The phase regulation loop has a phase detector that compares a desired signal with a feedback signal and generates a control signal for the tunable filter. For further explanations in this regard, DE 10 2005 024 624 is referenced.

This principle is expanded by a side branch in the inventive design of such a circuit arrangement 100. This means that a feedback signal is now generated that is also influenced by an output signal of this side branch.

Figure 2:
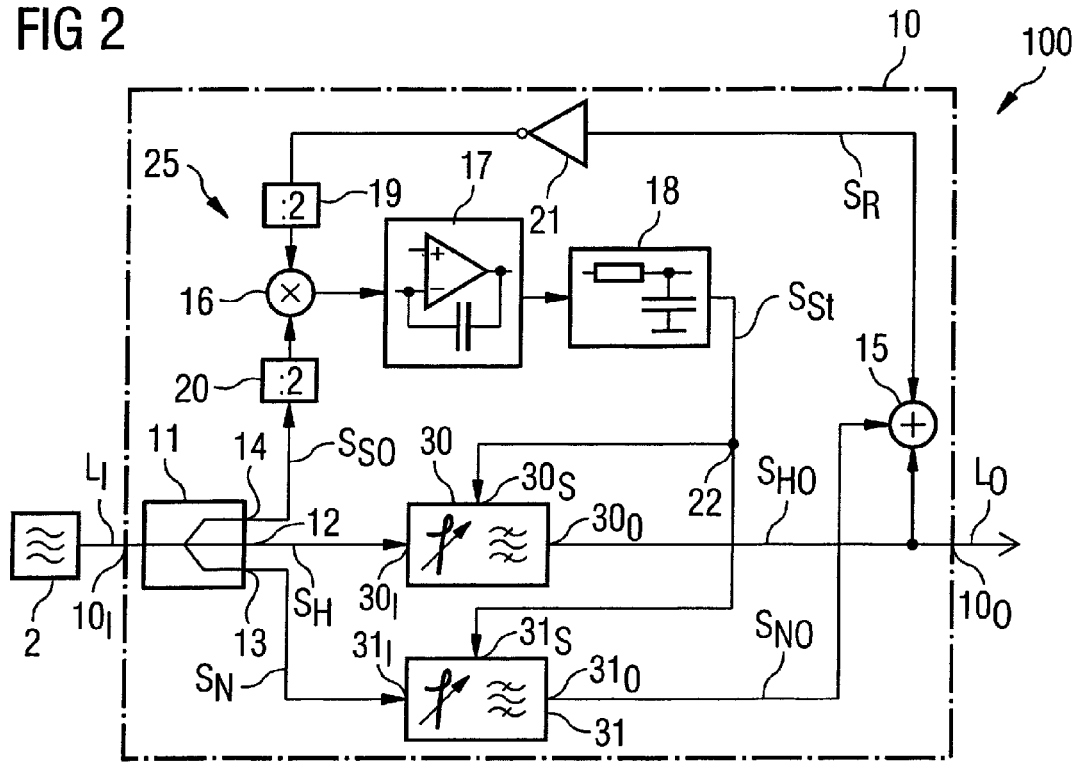
FIG. 2 is a block diagram of the basic components of an inventive circuit arrangement for generation of a local oscillator signal with a phase-regulated filter arrangement, according to a first exemplary embodiment of the invention.

In the exemplary embodiment shown in FIG. 2 the local oscillator signal $L_I$ to be filtered (which is generated by an oscillator 2, here a DDS oscillator 2) is provided at an input $10_I$ of the filter circuit arrangement 10 for this. A decoupled power splitter 11 with three outputs 12, 13, 14 is located on the input side inside the filter circuit arrangement 10. A signal portion $S_H$ for the main branch is output at the first output 12. This signal is passed to the input $30_I$ of a first tunable filter 30. A signal portion $S_N$ for the side branch is output at the second output 13 of the decoupled power splitter 11, which signal portion $S_N$ is directed to the input 31, of a second tunable filter 31. Finally, a desired signal $S_{SO}$ for the phase regulation loop 25 is output at the third output 14 of the power splitter 11.

Figure 10:
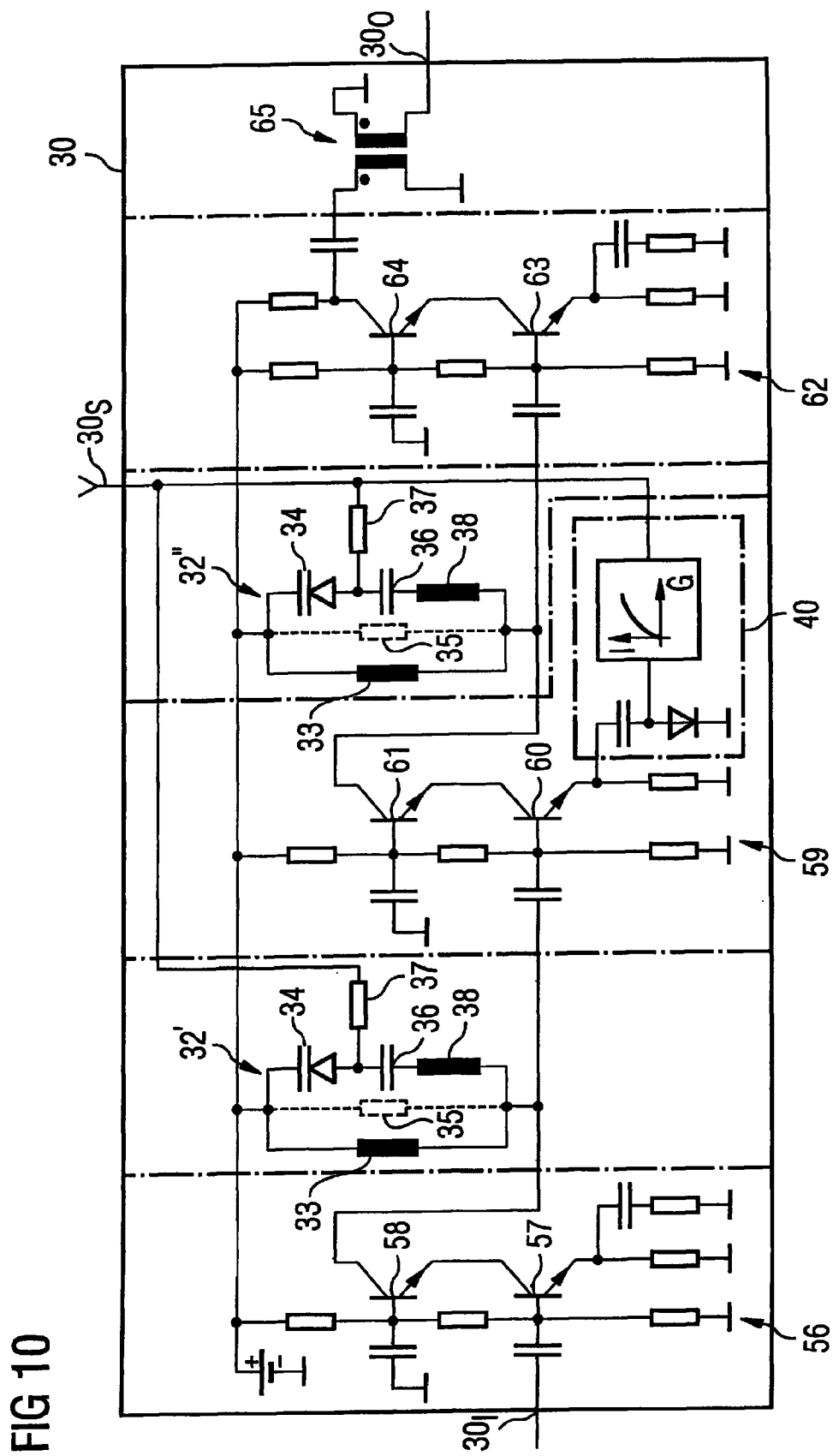
FIG. 10 is a circuit diagram of a tunable filter usable within the inventive filter circuit arrangement according to a further exemplary embodiment.

One possible design of the two tunable filters 30, 31 is explained later in detail using FIGS. 3 and 10. The signal present at the output $30_O$ of the first tunable filter 30 in the main branch is the output signal $L_O$ of the filter circuit arrangement 10 which is output at its output $10_O$. This signal is also simultaneously directed to an adder stage 15. The second input of this adder stage 15 is connected with the output $31_O$ of the second tunable filter 31 in the side branch. The input gates of the adder stage 15 are decoupled from one another optimally well.

The summed signal is directed back to the phase detector of the phase regulation loop 25 as a feedback signal $S_R$. It initially passes through an inverter 21 and subsequently a frequency splitter 19 in which the frequency of the feedback signal $S_R$ is halved. The desired signal $S_O$ is likewise directed through a frequency splitter 20 in which the frequency of the desired signal is halved. A simple multiplier 16 can then be used as a phase detector 16. This design with an inverter 21 and two frequency splitters 19, 20 for pre-processing of the input signals for the multiplier 16 has the following advantage:

The phase of the feedback signal is rotated by 180° by the inversion. By the division of the inverted feedback signal $S_R$ and of the desired signal $S_O$ by a factor of 2, it is moreover ensured that ultimately the phase offset between the desired signal $S_{SO}$ and the feedback signal $S_R$ amounts to precisely 90°. The characteristic line of the multiplier 16 used as a phase discriminator follows in the form of a cosine function of the difference between the phase of the feedback signal $S_R$ and the phase of the desired signal $S_{SO}$. The described pre-processing of the signals causes the phase difference between the feedback signal $S_R$ and the desired signal $S_{SO}$ to amount to precisely 90° when the output signal coincides in terms of phase with the input signal. This means that in the locked operating state of the phase regulation loop a detector voltage of zero volts appears at the output of the multiplier 16. This has the advantage that only the phase enters into the regulation and amplitude differences are suppressed.

Figure 1:
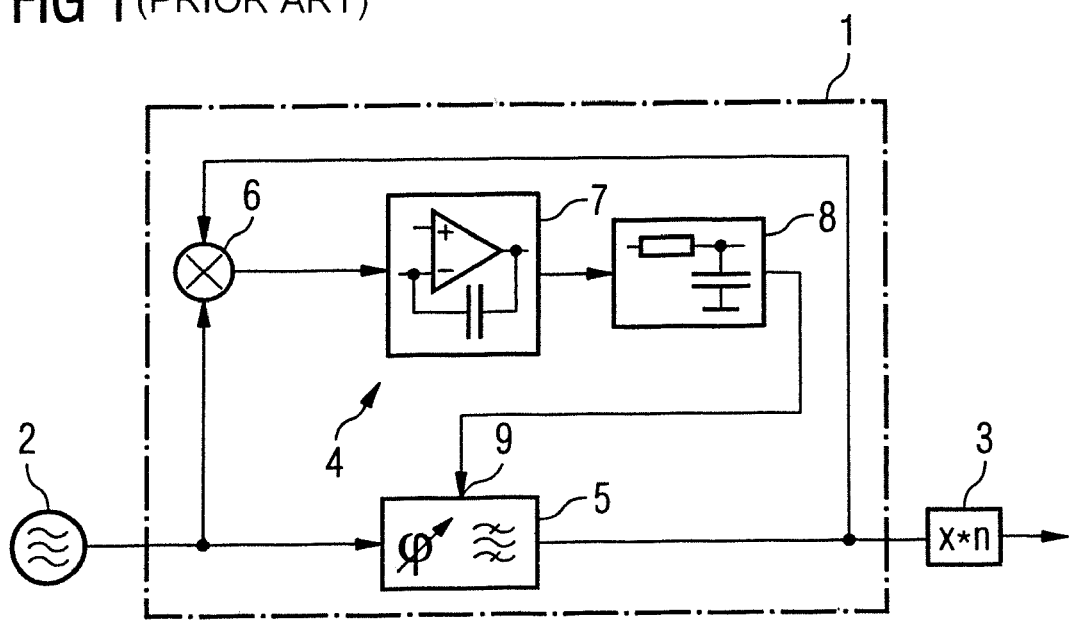
FIG. 1 is a block diagram of the basic components of a circuit arrangement for generation of a local oscillator signal with a conventional phase-regulated filter arrangement.

An alternative possibility to this design is explained in the aforementioned DE 10 2005 024 624 in connection with the previously used phase regulation loop according to FIG. 1. In this case what is known as a π-element is integrated within the employed tunable filter. This π-element acts in a narrow-band manner on the operating frequency as an impedance inverter with a phase shift of −90°. The inverter 21 and the frequency splitters 19, 20 can be foregone. However, the variant described here in FIG. 2 has the advantage that in principle a filter without internal phase shift can also be used. This arrangement additionally achieves a phase shift that sufficiently corresponds to precisely −90° over a wide frequency range.

In order to generate a suitable control signal $S_{ST}$ for the control inputs $30_S$, $31_S$ of the tunable filters 30, 31 from the detector signal generated by the multiplier 16, an integral regulator 17 is arranged downstream from the output of the multiplier 16. Possible noise of the multiplier 16 and of the operation amplifier in the integral regulator 17 can be effectively suppressed via a downstream low-pass filter 18. The control signal $S_{ST}$ is then split at a branch 22 and passed to both control inputs $30_S$, $31_S$ of the two tunable filters 30, 31.

Figure 3:
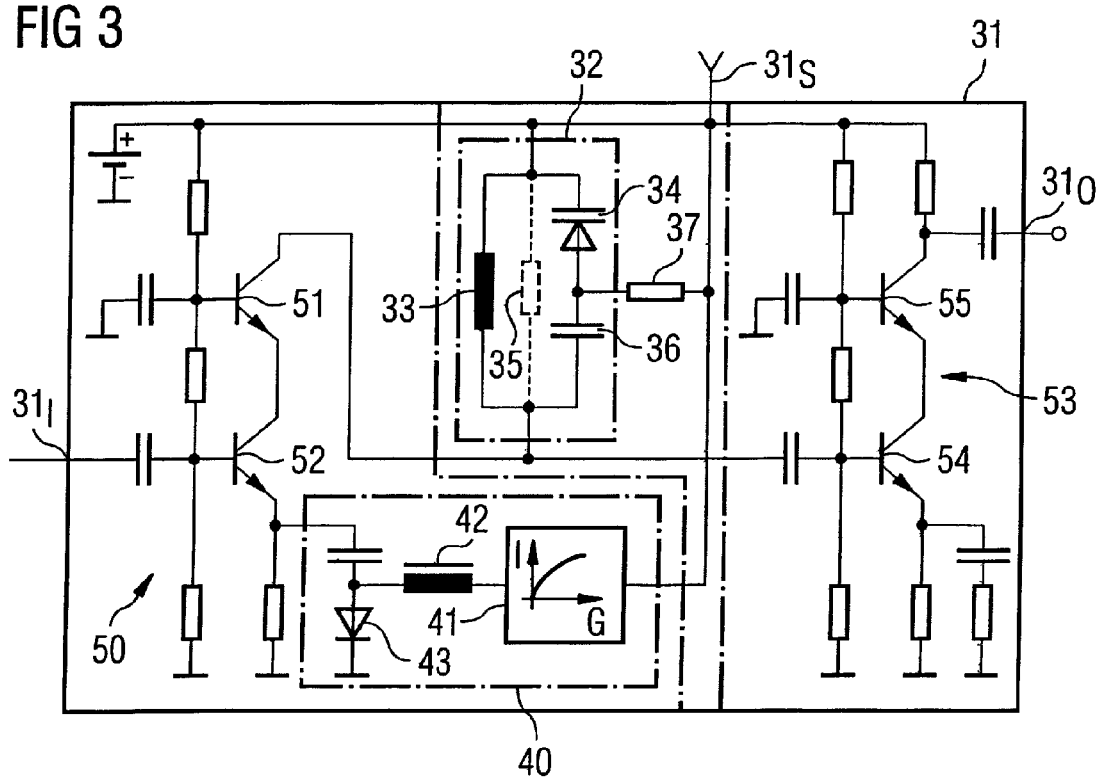
FIG. 3 is a circuit diagram of a tunable filter usable within the inventive filter circuit arrangement according to FIG. 2, according to a first exemplary embodiment.

A preferred design of these filters is presented in the example of the second filter 31 for the side branch in FIG. 3.

The central point of the filter 31 is an LC oscillating circuit 32 which is designed with a typical coil 33 and a detuneable capacitor [capacitance] 34. Moreover, a fixed capacitor 36 is connected in series with the detuneable capacitor 14. The detuneable capacitor 34 is here a varactor diode 34 that is connected via a resistor 37 with the control signal input $31_S$ of the filter 31. The higher the blocking voltage at the varactor diode 34, the lower its capacity, so the resonance of the LC oscillating circuit 32 is increased. In this manner the filter center frequency and thus the transmission phase of the filter 31 is adjusted by means of the control signal $S_{ST}$. Alternatively, the fixed capacitor 36 can also be replaced in a typical manner by a diode connected anti-parallel to the varactor diode 34.

The resistor 35 connected in parallel to the coil 33 and to the adjustable capacitor 34 in the oscillating circuit 32 serves for adjustment of the operating performance and thus of the bandwidth of the oscillating circuit 32. The operating performance of the oscillating circuit is determined by the level of the value of the parallel resistor 35, i.e. by the resistive load of the oscillating circuit. The greater the resistance 35, the higher the operating performance of the oscillating circuit 32. With increasing operating performance of the oscillating circuit, its bandwidth decreases.

The filter 31 respectively decoupled by cascode amplifiers 50, 53 both at the input side and at the output side. These cascode amplifiers are respectively designed in a typical manner with the aid of two transistors 51, 52, 54, 55. They serve to decouple the actual filtering part (namely the oscillating circuit 32) optimally well so that the entire filter 31 can be arbitrarily connected to the outside without detuning or attenuating the oscillating circuit 32. Moreover, a fundamental attenuation within the tunable filter 31 can be set via these cascode amplifiers 50, 53.

The amplitude response (i.e. a dependency of the amplitude across the set frequency) can be compensated by tracking of the reverse feedback [negative feedback, inverse feedback, degeneration] of one of the two amplifiers 50, 53. In the exemplary embodiment shown in FIG. 3 a compensation circuit 40 for this is located in the input-side cascode amplifier 50, in which compensation circuit 40 a portion of the current reverse feedback resistance of the amplifier 50 is formed by a PIN diode 43 which is controlled via an inductance 42 of a current/voltage converter (U/I converter) 41. This U/I converter 41 is connected on the input side with the control input $31_S$ of the filter 31. In the U/I converter 41 the control signal $S_{ST}$ which corresponds to a specific control voltage is converted into a current signal. A control current for the PIN diode is thus generated dependent on the control voltage in order to adjust the resistance of said PIN diode. For this purpose, the characteristic of the U/I converter 41 is designed such that the input frequency-dependent curve of the control signal $S_{ST}$ brings about a matching curve of the diode current, such that the amplitude response is compensated by the resulting amplitude change.

The filter 30 for the main branch can also be fashioned in the same manner as the second detuneable filter 31 shown in FIG. 3. However, according to the invention this filter 30 should exhibit a lower attenuation and a smaller bandwidth in order to thus ensure a higher selectivity. As explained above, the bandwidth of the filter depends on the operating performance of the oscillating circuit 32 and thus directly on the value of the parallel resistance 35. In order to achieve an optimally high operating performance in the main branch filter 30, the parallel resistance 35 is omitted there. In contrast to this, a parallel resistance 35 of approximately 120Ω is used in the side branch, for example.

Moreover, the fundamental attenuation is set different in the two filters via the cascode amplifiers 50, 53. A somewhat stronger attenuation of approximately 2 to 5 dB (advantageously 3 dB) than in the filter 30 in the main branch is thus set in the filter 31 for the side branch via the cascode amplifiers 50, 53.

Incidentally, in principle a plurality of resonators or, respectively, oscillating circuits 32 in the filter 30 for the main branch can also advantageously be cascaded via decoupling buffer amplifiers. For the side branch it is generally sufficient to use a single oscillating circuit 32 as this is presented in FIG. 3. Since the filters 30, 31 moreover are designed identically and comprise identical resonators, the resonance frequencies of all resonators always vary synchronously as a function of the control signal (or, respectively, of the control voltage).

The operation of the entire filter circuit arrangement 10 is as follows:

During the locking process of the phase regulation loop 25 the output signal $S_{NO}$ of the filter 31 of the side branch (side signal) nearly exclusively determines the feedback signal $R_S$. The tuning of the two filters 30, 31, however, occurs synchronously. Shortly before the locking, the center frequencies of both filters 30, 31 are therefore located near the frequency of the input signal $L_I$. The output signal $S_{HO}$ of the filter 30 in the main branch (main signal) is attenuated only slightly in this range and increasingly dominates the feedback signal $S_R$ with oscillating frequency separation. Near the filter center frequency, the phase response in the filter 30 of the main branch is distinctly steeper than that in the side branch due to the higher operating performance as well as the greater number of resonators. Additionally, via a suitable design of the paths (i.e. the amplification) it is ensured that the level of the main signal $S_{HO}$ lies clearly above that of the side signal $S_{HO}$ in the resonance case before the summation stage. In the locked state of the phase regulation loop 25 the regulation therefore ensues nearly exclusively via the filter 30 of the main branch.

Figure 4:
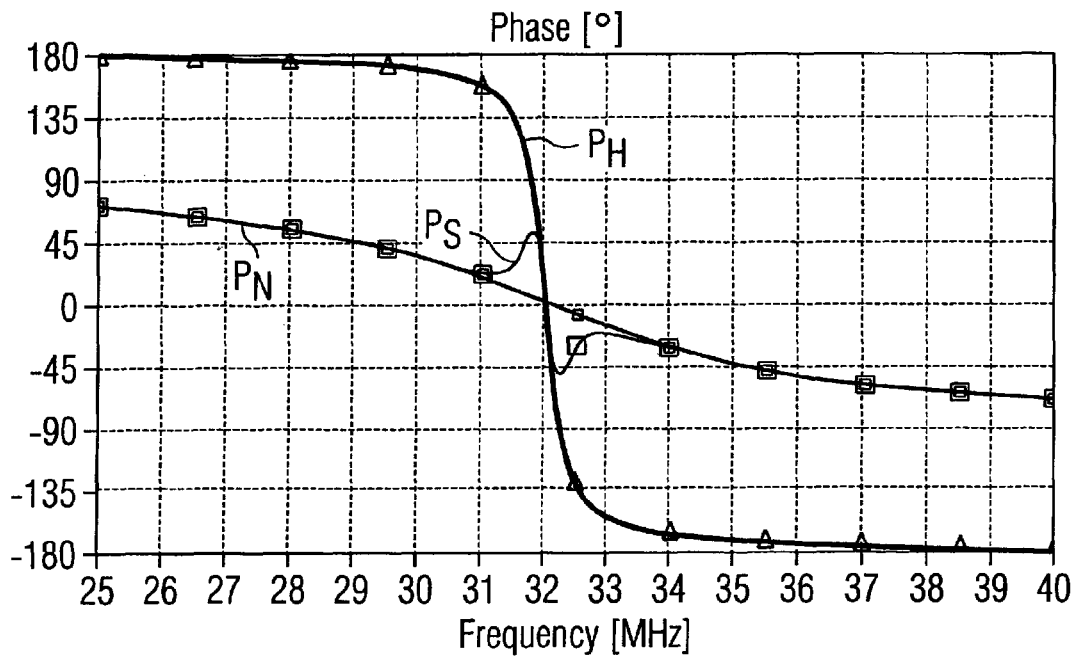
FIG. 4 is a diagram showing the transmission phases of the detuneable filter in the main branch and the detuneable filter in the side branch within an inventive filter circuit arrangement, as well as the transmission phase of the sum signal path.

The curve of the transmission phase $P_H$ of the filter in the main branch, the transmission phase $P_N$ of the filter 31 in the side branch as well as the transmission phases $P_S$ of the sum signal path (after the adder) are shown in FIG. 4. The phase from −180° to 180° is graphed over the frequency in MHz.

Figure 5:
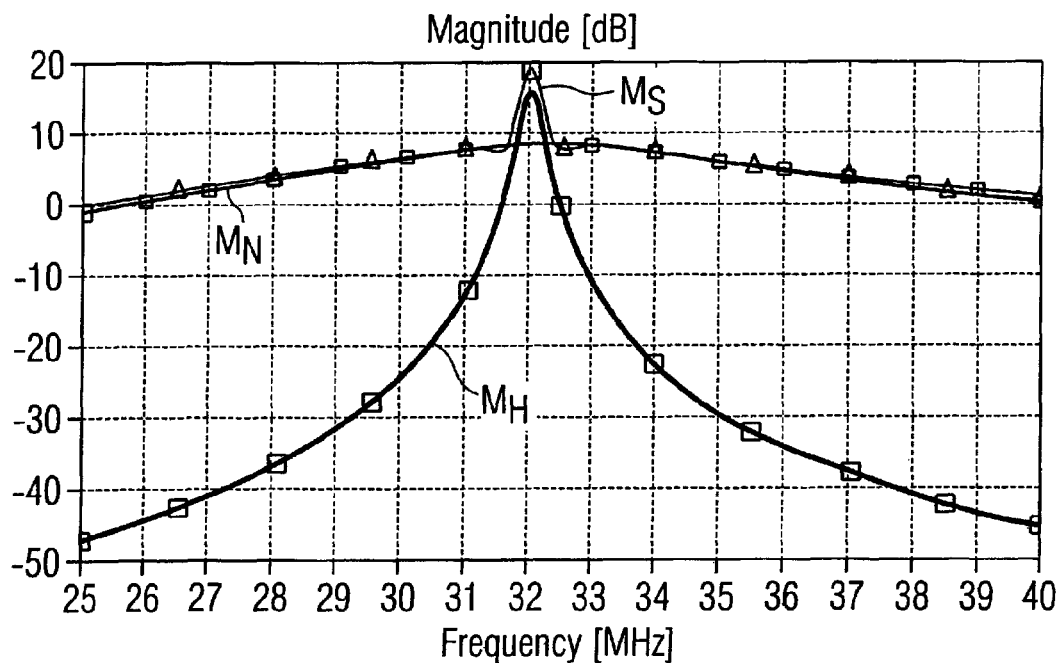
FIG. 5 is a diagram showing the filter attenuation of the tunable filter in the main branch and the tunable filter in the side branch within an inventive filter circuit arrangement as well as the attenuation to the point of the output of the adder.

Corresponding thereto, the graphs presented in FIG. 5 (via which the bandwidth of the filter is also depicted) correspond for the filter attenuations. It can be seen that the attenuation curve $M_H$ in the main branch is significantly steeper and runs more narrowly than the attenuation curve $M_N$ running nearly in a straight line in the side branch. Shown here as well is a sum attenuation-curve $M_S$ that results from the sum of the attenuation curve $M_H$ for the filter 30 in the main branch and the attenuation curve $M_N$ for the filter 31 in the side branch. This is attenuation curve $M_S$ that is decisive for the regulation within the phase regulation loop 25, which attenuation curve $M_S$ can be measured between the input 10, of the filter circuit arrangement 10 and a measurement point after the adder stage 15 (in the feedback branch).

Figure 6:
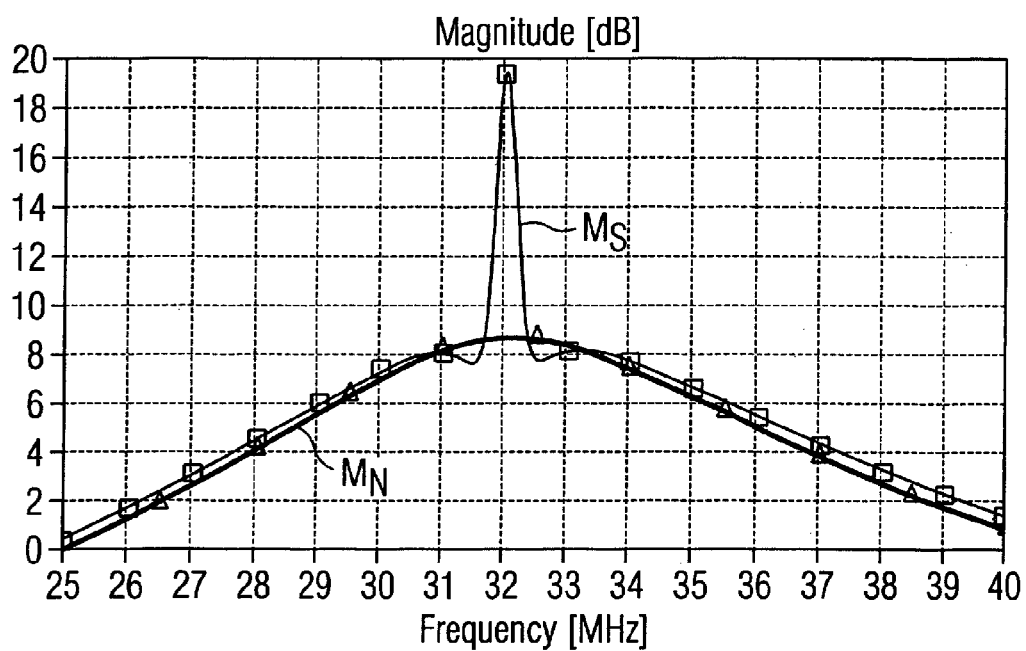
FIG. 6 is an enlarged representation of the upper region of the diagram of FIG. 6, but without the representation of the filter attenuation in the main branch.

FIG. 6 shows an enlarged section of the upper part of this diagram, whereby the attenuation curve $M_H$ of the filter was omitted in the main branch. As said, the shape of the sum attenuation curve $M_S$ is decisive here. From this it is also very apparent that the attenuation curve $M_N$ of the filter 31 in side branch dominates over a very large frequency bandwidth. Only in the range near the center frequency (here at 32 MHz) is the sum attenuation curve $M_S$ dominated by the attenuation curve $M_H$ of the filter in the main branch. Overall this leads to the situation that, although the inventive filter arrangement exhibits a very large capture range, in the end in the locked state (i.e. when the filter center frequency is adjusted to match the input signal) the selectivity is ultimately provided by the very narrow bandwidth of the filter 30 in the main branch.

The measurements to acquire the diagrams shown in FIGS. 4 through 6 were implemented on a filter circuit arrangement in which the detuneable filter 30 in the main branch comprises two cascaded resonators in order to increase its selectivity. A specific example of a cascaded design is shown in FIG. 10 and is explained in more detail below. In the measurements the control voltage (i.e. the control signal $S_{ST}$) for the control inputs $30_S$, $31_S$ of the two filters 30, 31 was disconnected at the point 22 and instead of this the control signal is set to a fixed value with a mains supply unit. The signal frequency of the input signal was then varied and the frequency response was acquired using a network analyzer. The sum signal was tapped immediately after the adder stage 15.

As described above, in the locked state the side branch is actually no longer necessary. In principle the side branch can therefore also be completely deactivated. It can therewith very safely be avoided that signal portions overcouple from the side branch into the main branch via the adder 15 and thus reduce the selection of the entire filter circuit arrangement 10.

Figure 7:
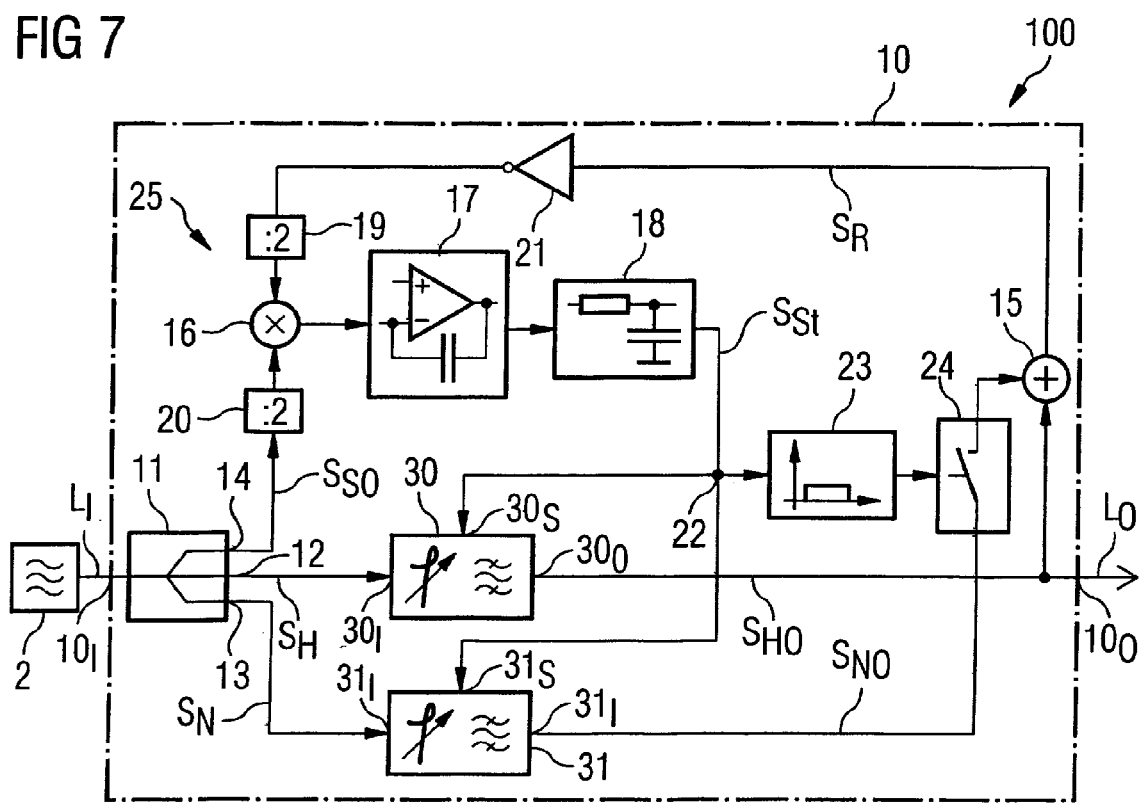
FIG. 7 is a block diagram of the basic components of an inventive circuit arrangement for generation of a local oscillator signal with a phase-regulated filter arrangement according to a second exemplary embodiment of the invention.

A corresponding variant of the inventive circuit arrangement is shown in FIG. 7. This circuit arrangement is essentially designed just like the circuit in FIG. 2. However, at point 22 the control signal $S_{ST}$ is additionally supplied to a window comparator 23 which acts as a "lock detect" circuit. Namely, if the regulatory loop 25 is located in the unlocked state, the control signal $S_{ST}$ exhibits either a maximum or a minimum value. The window comparator 23 consequently detects the locked state since the control signal then lies in a middle range, i.e. a specific window. Insofar as the control signal $S_{ST}$ can assume voltage values between 0 and 10 volts, the window can cover a range between 1 and 9 volts, for example. If this locked state is detected over a predetermined time duration, a signal is provided by the window comparator 23 to a switching element 24 and the connection from the output 31$_O$ of the filter 31 in the side branch to the adder 15 is thus interrupted.

With the inventive circuit arrangement 100 it is thus possible to generate a very precise, narrowband local oscillator signal which can also be detuned over a wide frequency range. This signal can then be processed further in an arbitrary manner. For example, the signal $L_O$ can be supplied to a frequency multiplier (as this is shown in FIG. 1) insofar as this is desired.

In the following it is explained using a further example how, by suitable design of an oscillating circuit in the tunable filter 30, it can ensured that the attenuation characteristic exhibits an attenuation notch in a specific frequency position. The attenuation characteristic is advantageously set such that the attenuation notch lies precisely at the second harmonic of the center frequency of the filter 30.

Figure 8:
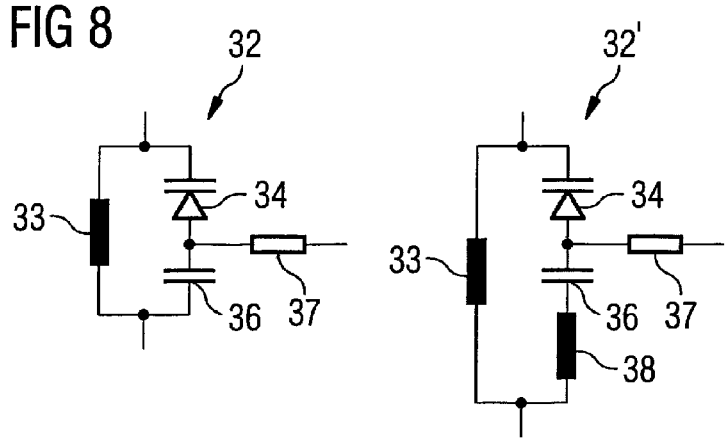
FIG. 8 is a circuit diagram of an oscillating circuit for a tunable filter according to FIG. 3 and, for comparison, a modified oscillating circuit for realization of an attenuation notch in the attenuation characteristic of the filter.

In this regard, FIG. 8 shows again on the left side the simple oscillating circuit of the filter from FIG. 3, however not without the optional resistor. If this simple oscillating circuit is expanded into the network shown on the right in FIG. 8, with an additional inductor 38 connected in series with the capacitors 34, 36, the transfer function of the filter circuit thus exhibits a pronounced attenuation notch. The relative frequency position of this attenuation notch relative to the filter center frequency thereby appears independent of the tuning capacitance formed from the individual capacitive components 34, 36. The inductive elements 33, 36 can therefore be dimensioned such that the attenuation notch always comes to lie at a harmonic of the input signal (=filter center frequency). The order n of the harmonics can thereby be freely selected. The correct dimensioning can be determined as follows:

For this purpose, it is initially assumed that $L_0$ is the value of the inductance 33 and C is the value of the tuning capacitance formed by the two capacitive components 34, 36 in a simple oscillating circuit which oscillates with the frequency $\omega_0$. The value $L_1$ of the inductance 33 and the value $L_2$ of the inductance 38 are sought at a given tuning capacitance value C, such that the desired attenuation notch lies at the n-th harmonic of the frequency $\omega_0$.

The attenuation notch is generated by the series resonance that is formed by the values C and L2 given $n \cdot \omega_0$.

The impedance of the entire network (to the right in FIG. 8) for an arbitrary angular (radian) frequency results in:

$$Z = \frac{1}{\frac{1}{j\omega L} + \frac{1}{j\omega L + \frac{1}{j\omega C}}} = j\frac{\omega LL - \frac{L}{C}}{\omega L + L - \frac{1}{\omega C}} \quad (1)$$

The filter center frequency $\omega_P$ of this network can be calculated from this:

$$\omega_P L += \frac{1}{\omega_P C} \Leftrightarrow \frac{1}{\sqrt{L + LC}} \quad (2)$$

The notch frequency $\omega_S$ (i.e. the frequency $\omega_S$ at which the attenuation lies) is then:

$$\frac{L}{C} = \omega_S LL \Leftrightarrow \omega_S = \frac{1}{\sqrt{LC}} \quad (3)$$

The ratio of the value $L_1$ of the inductance 33 to the value $L_2$ of the inductance 38 results from the specification that the notch frequency $\omega_S$ should fall at the n-th harmonic of the input signal (i.e. the filter center frequency $\omega_P$):

$$\omega_S = n \cdot \omega_P \Rightarrow \frac{1}{\sqrt{LC}} = n \cdot \frac{1}{\sqrt{L+LC}} \Leftrightarrow L = \frac{L}{n-} \quad (4)$$

The values $L_1$ and $L_2$ of the inductances 33, 38 for the modified oscillating circuit (FIG. 8, right) can be calculated with the filter center frequency $\omega_0$, the value $L_0$ of the inductance 33 and the value C of the tuning capacitance of the original simple oscillating circuit (FIG. 8, left):

$$\omega = \frac{1}{\sqrt{LC}}; \omega_P = \omega \Rightarrow \frac{1}{\sqrt{LC}} = \frac{1}{\sqrt{L+LC}} \Leftrightarrow L = L + L = L\frac{n}{n-} \quad (5)$$

Figure 9:
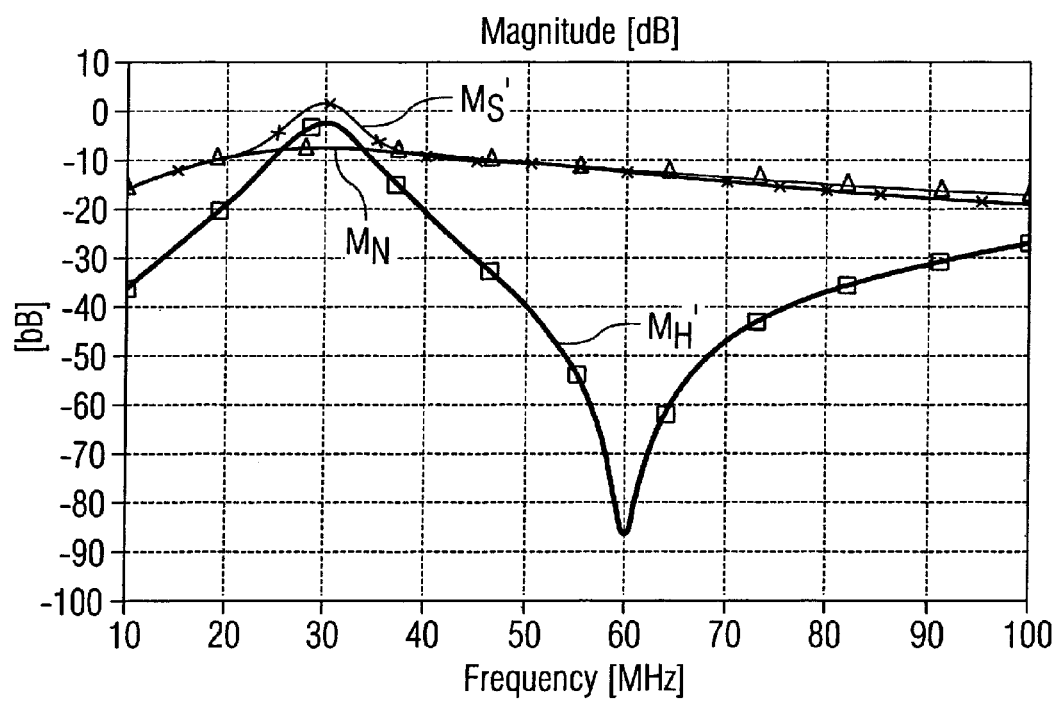
FIG. 9 is a diagram showing the filter attenuation of a detuneable filter with an attenuation notch that is used in the main branch of the filter circuit arrangement, the filter attenuation of a detuneable filter in the side branch as well as the attenuation to the point of the output of the adder.

FIG. 9 shows an attenuation curve $M_H'$ (i.e. the attenuation characteristic) of a detuneable filter 31 for the main branch in an inventive filter circuit arrangement with a corresponding attenuation notch at the 2nd harmonic (n=2). The filter center frequency here is set at 30 MHz. The attenuation notch correspondingly lies at 60 MHz. In the side branch the simple oscillating circuit remains unchanged, such that the same attenuation curve $M_N$ results for this as before. The capture range thereby extends from 10 MHz to 100 MHz. Also shown is the sum attenuation curve $M_S'$ acquired after the adder stage 15.

This filter circuit arrangement is suitable for, for example, the filtering of the signal of a frequency synthesizer whose adjustable frequency range extends across more than one octave (up to two octaves). Here the second harmonic cannot be suppressed by a fixed low-pass filter since it lies below the highest adjustable frequency. The attenuation notch ensures that precisely this harmonic is filtered out, whereby the position of the attenuation notch is carried synchronously with the center frequency of the filter and therefore is always situated appropriately for the input signal.

If the detuneable filter 31 is designed from a cascade of a plurality of oscillating circuits decoupled from one another, the second harmonic and the third harmonic can also be simultaneously suppressed, for example. This is shown in FIG. 10, in which a corresponding filter design with two oscillating circuits 32', 32" decoupled from one another is shown.

This filter 30 is also respectively decoupled both on the input side and on the output side via cascode amplifiers 56, 62. A further cascode amplifier 59 connected between the oscillating circuits 32', 32" provides for a decoupling of the oscillating circuits 32', 32" among one another. The cascode amplifiers 56, 59, 62 are respectively again designed in a typical manner with the aid of two transistors 57, 58, 61, 61, 63, 64. Here as well the amplitude response can be compensated, if necessary, via tracking of the reverse feedback of one of the amplifiers 56, 59, 62. For this purpose, in the exemplary embodiment presented in FIG. 10 a compensator circuit 40 which is designed as in FIG. 3 is located at the middle cascode amplifier 59.

Since in each cascode amplifier 56, 59, 62 the phase of the signal is rotated by −180°, given thus design with three cascode amplifiers 56, 59, 62 the signal must be inverted again given this design. It is thereby ensured that the output signal in the locked operation has the same phase as the output signal of the parallel filter 31 in the side branch (which comprises only two cascode amplifiers 50, 53). For this purpose, a transformer 65 is located at the output of the filter 30. However, instead of this transformer 65 another circuit part can also be used in order to rotate the phase by −180°. Insofar as a filter that effects a phase rotation by −180° is likewise used in the side branch, the output-side circuit portion for rotation of the phase can also be foregone. The signals in the main branch and side branch, with their phase of −180°, can then respectively be added in the adder stage 15, and the inverter 21 in the feedback branch (see FIG. 2) can be omitted in this case.

Figure 11:
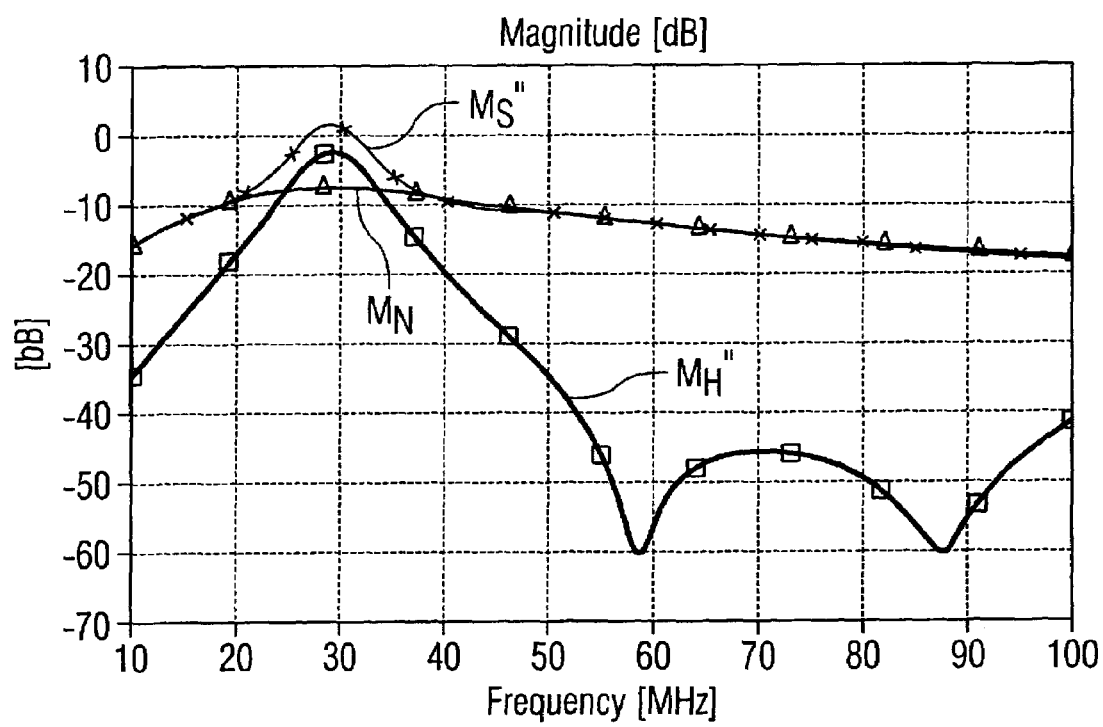
FIG. 11 is a showing the filter attenuation of a detuneable filter with two attenuation notches that is used in the main branch of the filter circuit arrangement, the filter attenuation of a detuneable filter in the side branch as well as the attenuation to the point of the output of the adder.

FIG. 11 shows the attenuation curve $M_H''$ of a corresponding filter 31 for the main branch which respectively exhibits an attenuation notch at the 2nd harmonic and at the 3rd harmonic. For this a filter 30 according to FIG. 10 was used in which the first oscillating circuit 32' is designed for n=2 according to equation (6) and the second oscillating circuit 32" is designed for n=3 according to equation (6). The filter center frequency here is again set at 30 MHz. The first attenuation notch accordingly lies at the 60 MHz and the second attenuation notch at 90 MHz. Here as well the simple oscillating circuit in the side branch remains unchanged, such that the typical attenuation curve $M_N$ which defines the capture range between −10 MHz and 100 MHz results for this. Also shown again is the sum attenuation curve $M_S'$ acquired after the adder stage 15. With this filter design, the frequency position of the attenuation notches can be automatically tracked across more than two octaves given a frequency change.

It should be noted that it is possible to use other filter types than the filter designs described in connection with FIGS. 3 and 10. The invention can be used in the most varied fields (in particular in messaging technology or medical technology) in which high quality local oscillators that can be accurately adjusted particularly well are required.

Although modifications and changes may be suggested by those skilled in the art, it is the intention of the inventors to embody within the patent warranted hereon all changes and modifications as reasonably and properly come within the scope of their contribution to the art.

We claim as our invention:

1. A filter circuit arrangement for filtering a radio-frequency signal having a frequency, comprising:
    a first tunable filter having an attenuation characteristic;
    a phase regulation loop that holds said first tunable filter to a transmission phase that is constant relative to the frequency of the radio-frequency signal;
    a second tunable filter connected in parallel with the first tunable filter in the phase regulation loop, said second tunable filter having an attenuation characteristic that is different from the attenuation characteristic of the first tunable filter; and
    said first tunable filter and said second tunable filter being connected within said phase regulation loop to cause a capture range of the filter circuit arrangement, in which tuning of the phase regulation loop to the radio-frequency signal is possible, to be dominated by the attenuation characteristic of the second tunable filter, and to cause a transmission behavior of the filter circuit arrangement to be dominated by the attenuation characteristic of the first tunable filter when the phase regulation loop is tuned to said radio-frequency signal.

2. A filter circuit arrangement as claimed in claim 1 wherein said first tunable filter has a narrower filter bandwidth than said second tunable filter.

3. A filter circuit arrangement as claimed in claim 1 wherein said attenuation characteristic of said first tunable filter has at least one attenuation notch.

4. A filter circuit arrangement as claimed in claim 3 wherein said at least one attenuation notch is in a range of a harmonic of a center frequency of the first tunable filter.

5. A filter circuit arrangement as claimed in claim 1 comprising a power splitter to which said input signal is fed that splits said input signal into a first partial signal for the first tunable filter, a second partial signal for the second tunable filter, and a third partial signal that is supplied to said phase regulation loop for use by said phase regulation loop as a reference value signal.

6. A filter circuit arrangement as claimed in claim 5 wherein each of said first tunable filter and said second tunable filter has an output, and comprising an adder element connected to the respective outputs of the first tunable filter and the second tunable filter, said adder element adding the respective outputs of said first and second tunable filters to form an adder element output, said adder element output forming a feedback signal within said phase regulation loop.

7. A filter circuit arrangement as claimed in claim 6 comprising an inverter supplied with said adder element output that inverts said feedback signal to form an inverted feedback signal;
    a first frequency splitter connected downstream of said inverter that halves a frequency of said inverted feedback signal;
    a second frequency splitter, that halves a frequency of said reference value signal, connected downstream of an output of the power splitter;
    each of said first and second frequency splitters having an output; and
    a multiplier element connected to the respective outputs of the first and second frequency splitters, which multiplies the halved inverted feedback signal and the halved reference value signal to generate a control signal for said first and second tunable filters.

8. A filter circuit arrangement as claimed in claim 7 comprising a switching element connected between the output of the second tunable filter and the adder element, and a detector circuit that controls said switching element by interrupting supply of the output signal of the second tunable filter to the adder element when said phase regulation loop is tuned.

9. A filter circuit arrangement as claimed in claim 1 wherein said first tunable filter comprises first resonators and wherein said second tunable filter comprises second resonators, said first resonators being substantially identical to said second resonators.

10. A filter circuit arrangement as claimed in claim 1 wherein said attenuation characteristic of said second tunable filter exhibits a stronger fundamental attenuation than said attenuation characteristic of said first tunable filter.

11. A filter circuit arrangement as claimed in claim 1 wherein each of said first and second tunable filters comprises an oscillating circuit comprising an inductor and an adjustable capacitor connected to a control input of the respective first and second tunable filters.

12. A filter circuit arrangement as claimed in claim 11 wherein at least said second tunable filter comprises an ohmic resistor connected in parallel with said inductor and said adjustable capacitor in said oscillating circuit.

13. A filter circuit arrangement as claimed in claim 11 comprising, in each oscillating circuit, at least one inductor connected in series with the adjustable capacitor to produce an attenuation notch in the attenuation characteristic for the respective first and second tunable filters.

14. A filter circuit arrangement as claimed in claim 11 wherein at least one of said first and second tunable filters comprises a decoupled buffer amplifier connected at an input side preceding the oscillating circuit and at an output side following the oscillating circuit.

15. A filter circuit arrangement as claimed in claim 11 wherein the oscillating circuit of at least one of said first and second tunable filters comprises a plurality of cascaded oscillating circuits.

16. A circuit arrangement for generating a local oscillator signal comprising:
an oscillator generator that generates a radio-frequency signal; and
a filter circuit arrangement that filters said radio-frequency signal, said filter circuit arrangement comprising a first tunable filter having an attenuation characteristic, a phase regulation loop that holds said first tunable filter to a transmission phase that is constant relative to the frequency of the radio-frequency signal, a second tunable filter connected in parallel with the first tunable filter in the phase regulation loop, said second tunable filter having an attenuation characteristic that is different from the attenuation characteristic of the first tunable filter, and said first tunable filter and said second tunable filter being connected within said phase regulation loop to cause a capture range of the filter circuit arrangement, in which tuning of the phase regulation loop to the radio-frequency signal is possible, to be dominated by the attenuation characteristic of the second tunable filter, and to cause a transmission behavior of the filter circuit arrangement to be dominated by the attenuation characteristic of the first tunable filter when the phase regulation loop is tuned to said radio-frequency signal, and, said filter circuit arrangement having an output connected to said first and second tunable filters at which a local oscillator signal is emitted that is generated by said first and second tunable filters from said radio-frequency signal.

* * * * *